United States Patent [19]

Araki

[11] Patent Number: 5,418,806
[45] Date of Patent: May 23, 1995

[54] POWER CONTROL DEVICE FOR LASER EMITTING UNIT

[75] Inventor: Yoshiyuki Araki, Tokyo, Japan

[73] Assignee: Asahi Kogaku Kogyo Kabushiki Kaisha, Tokyo, Japan

[21] Appl. No.: 151,136

[22] Filed: Nov. 12, 1993

[30] Foreign Application Priority Data

Nov. 16, 1992 [JP] Japan ................. 4-328931

[51] Int. Cl.[6] .............................................. H01S 3/00
[52] U.S. Cl. ............................ 372/29; 372/30; 372/38; 372/109
[58] Field of Search ................. 372/29, 30, 31, 38, 372/43, 50, 108, 109

[56] References Cited

U.S. PATENT DOCUMENTS

| | | | |
|---|---|---|---|
| 4,685,097 | 8/1987 | van der Put | 346/76 L |
| 4,727,382 | 2/1988 | Negishi et al. | 346/108 |
| 4,748,633 | 5/1988 | Negishi | 372/38 |
| 4,761,659 | 8/1988 | Negishi | 346/108 |
| 4,802,179 | 1/1989 | Negishi | 372/38 |
| 4,884,278 | 11/1989 | Nishimoto et al. | 372/26 |
| 4,884,280 | 11/1989 | Kinoshita | 372/38 |
| 4,903,273 | 2/1990 | Bathe | 372/38 |
| 4,945,541 | 7/1990 | Nakayama | 372/31 |
| 5,015,846 | 5/1991 | Okuyama et al. | 250/235 |
| 5,134,623 | 7/1992 | Egawa et al. | 372/38 X |
| 5,224,112 | 6/1993 | Uesaka | 372/38 |
| 5,315,606 | 5/1994 | Tanaka | 372/38 |
| 5,349,594 | 9/1994 | Ogawa et al. | 372/38 |
| 5,355,383 | 10/1994 | Lockard | 372/38 |

Primary Examiner—Brian Healy
Attorney, Agent, or Firm—Sandler, Greenblum & Bernstein

[57] ABSTRACT

In a power controlling device for laser emitting apparatus, a laser diode and a photodiode are provided. Current is generated by the photodiode in accordance with the intensity of laser beam received. The current flows across a resistor to generate a voltage, which is compared with a reference voltage. There is further provided a circuit for generating the reference voltage, which includes a pulse signal generating circuit in which a duty cycle of the pulse signal is changeable, and a voltage generator which generates voltage in accordance with the duty cycle of the pulse signal. The laser diode is driven in accordance with the result of comparison of the voltage generated by the resistor with the reference voltage which is adjusted in accordance with the duty cycle of the pulse signal.

12 Claims, 6 Drawing Sheets

FIG. 8
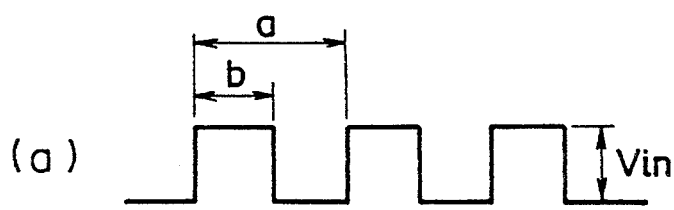
(a)
(b) $V = V_r \times \dfrac{R3}{R2+R3}$
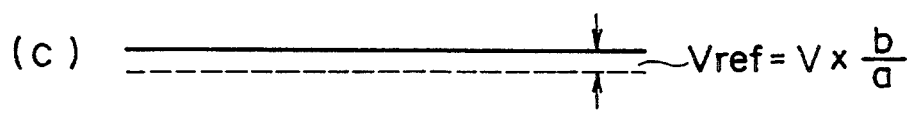
(c) $V_{ref} = V \times \dfrac{b}{a}$

POWER CONTROL DEVICE FOR LASER EMITTING UNIT

BACKGROUND OF THE INVENTION

The present invention relates to an automatic power control device used for controlling the intensity of laser beam emitted by a laser emitting unit.

In a laser beam printer, a laser scanning device is provided for emitting laser beam to scan a photoconductive material to form a latent image. The laser scanning unit includes a laser diode which is driven to emit A laser beam carrying image information. The emitted laser beam is deflected by a mirror to scan a uniformly charged circumferential surface of a photoconductive drum to form a latent image thereon. Then the latent image is developed, and the developed image is transferred onto a recording sheet, and fixed thereon in accordance with an electro-photographic image forming process.

In the laser scanning unit, in order to maintain uniform intensity of the laser beam emitted by the laser diode, an APC (Automatic Power Control) device is provided.

The APC device has a photodiode which receives the laser beam emitted from the laser diode and outputs a signal having a current that corresponds to the intensity of the received laser beam. This outputted current produces a voltage across a resistor connected in series with the photodiode. This voltage is detected as the laser output voltage and also corresponds to the intensity of the laser beam. The laser output voltage is compared with a reference voltage, and then the current that flows through the laser diode is varied accordingly, so that the above-described output voltage is substantially the same as the fixed reference voltage.

In order to cancel the differences in characteristics of individual photodiodes employed in different devices, it is preferable that the resistance of the resistor connected with the photodiode be variable.

Conventionally, a variable resistor is connected to the photodiode, and its resistance is adjustable so that the difference in characteristics of the photodiodes, efficiencies of the optical systems and the like, are canceled.

However, even if a laser scanning unit can be adjusted to exactly emit the specified intensity of the laser beam, since there are differences in the characteristics amongst individual photoconductive drums, it is still necessary to further adjust the intensity of the laser beam. Further, if the resolution density of the image is varied, or the scanning speed of the laser beam is varied, it becomes necessary to change the intensity of the laser beam.

If the resistance of the resistor connected to the photodiode is made smaller than the required value, the laser output voltage becomes smaller even though the laser diode emits the same intensity of the laser beam. In this condition, if the APC operation is then executed, the intensity of the laser beam increases until the output voltage again reaches the reference voltage. Thus, one solution to solve the aforementioned problem is to change the resistance of the variable resistor. A change in the resistance of the variable resistor changes the voltage across it, provided that the laser beam intensity remains the same. However, since the variable resistor is used for canceling the differences in characteristics of the individual photodiodes, it is difficult to further adjust the resistance in order to control the intensity of the laser beam. Further, the above-described situation would usually occur after the APC device has already been installed in the laser scanning unit, and the laser scanning unit has been installed in the laser beam printer. After the device has been assembled, is difficult to change the resistance of the variable resistor.

Another way to vary the intensity of the laser beam is to provide a plurality of fixed resistors between a power source and the photodiode, and selecting one of them by means of a switch. Thus the intensity of the laser beam can easily be changed by operating the switch. However, in this example, the number of intensity levels are determined by the number of resistors. In order to obtain a large number of intensity levels, a large number of resistors are required to be connected, resulting in complicated circuitry. Further, the intensity selected is a predetermined value, and therefore subtle changes or changes to values between the predetermined values cannot be made with this construction.

THE SUMMARY OF THE INVENTION

It is therefore an object of the present invention to provide an improved APC (Automatic Power Control) device for a laser emitting apparatus, with which subtle changes of the intensity of laser beam can easily be made.

For the above object, according to the present invention, there is provided a power controlling device for a laser emitting apparatus, comprising:

a laser diode for emitting laser beam;

first voltage generating means for generating voltage corresponding to the intensity of the emitted laser beam;

second voltage generating means for generating a reference voltage, wherein the second voltage generating means includes:
  (a) means for generating a pulse signal, a duty cycle of the pulse signal being changeable; and
  (b) means for producing the reference voltage in accordance with the duty cycle of the pulse signal;

comparing means for comparing the voltage generated by the first voltage generating means with the reference voltage generated by the second voltage generating means; and driving means for driving the laser diode so that the voltage generated by the first voltage generating means coincides with the reference voltage.

Optionally, the means for generating a pulse signal comprises:

means for generating a clock pulse signal;

means for determining a period of the pulse signal based on the clock pulse signal; and means for changing the ON/OFF states of the pulse signal in accordance with the number of pulses of the clock pulse signal within every period of the pulse signal, whereby the duty cycle of the pulse signal is changeable.

Further, the determining means comprises a divider circuit for determining the period by dividing the frequency of the clock pulse signal.

Furthermore, the means for generating a pulse signal comprises regulating means for regulating the magnitude of the pulse signal outputted therefrom to be a predetermined value.

DESCRIPTION OF THE ACCOMPANYING DRAWINGS

Figure 4:
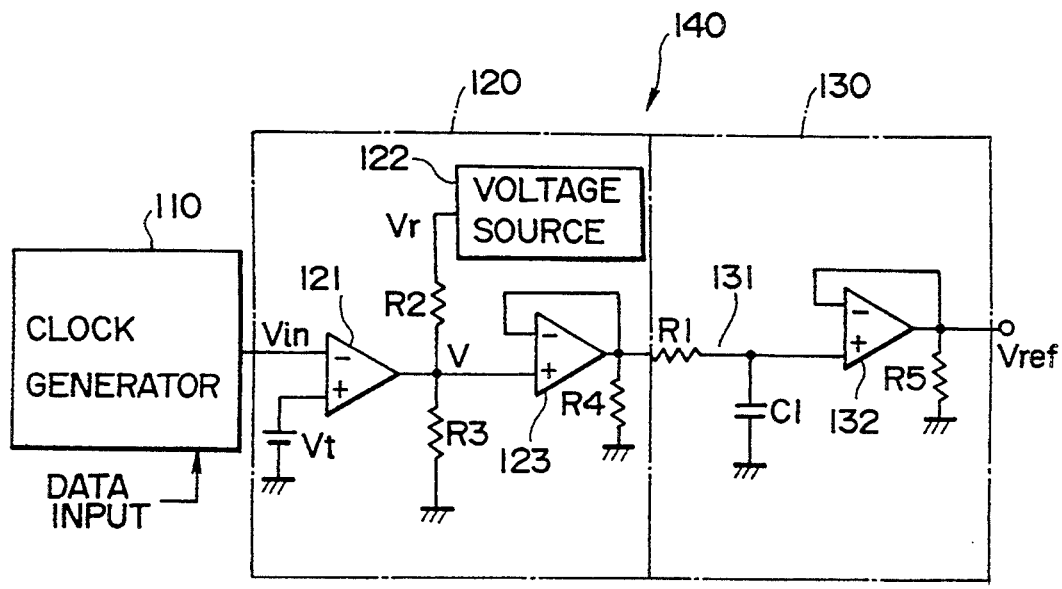
FIG. 4 is a reference voltage generating circuit.
Figure 9:
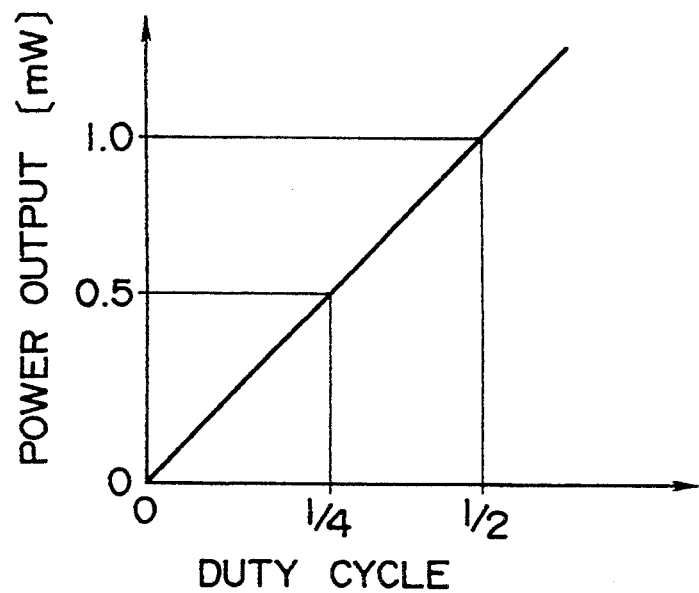
Figure 10:
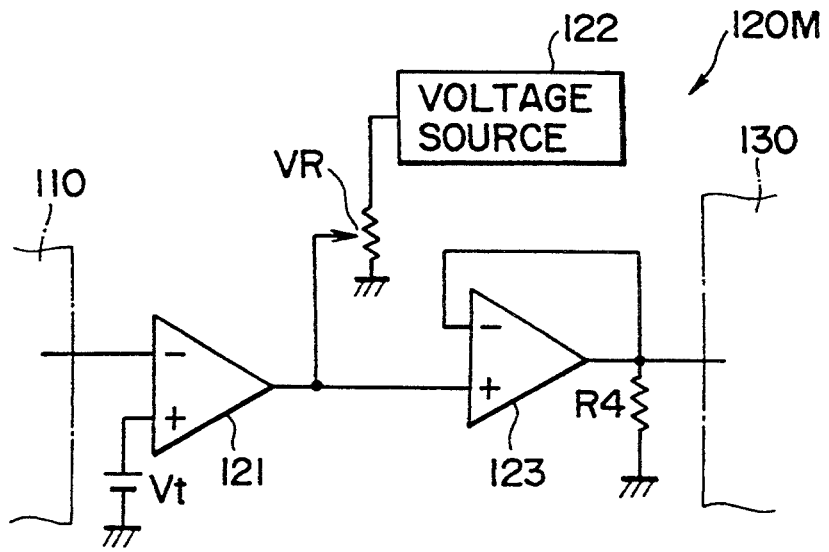

FIGS. 7(a)–(d) are timing charts showing output signals of an oscillator, a divider, a counter, and a gate circuit;

FIGS. 8(a)–(c) are timing charts showing voltages Vin, V, and Vref of the circuit of FIG. 4;

FIG. 9 is a graph showing the relationship between the duty cycle of the clock signal and energy of the emitted laser beam; and FIG. 10 is a modified level shift circuit which can be substituted for the one shown in the circuit of FIG. 4.

DESCRIPTION OF THE EMBODIMENTS

Figure 1:
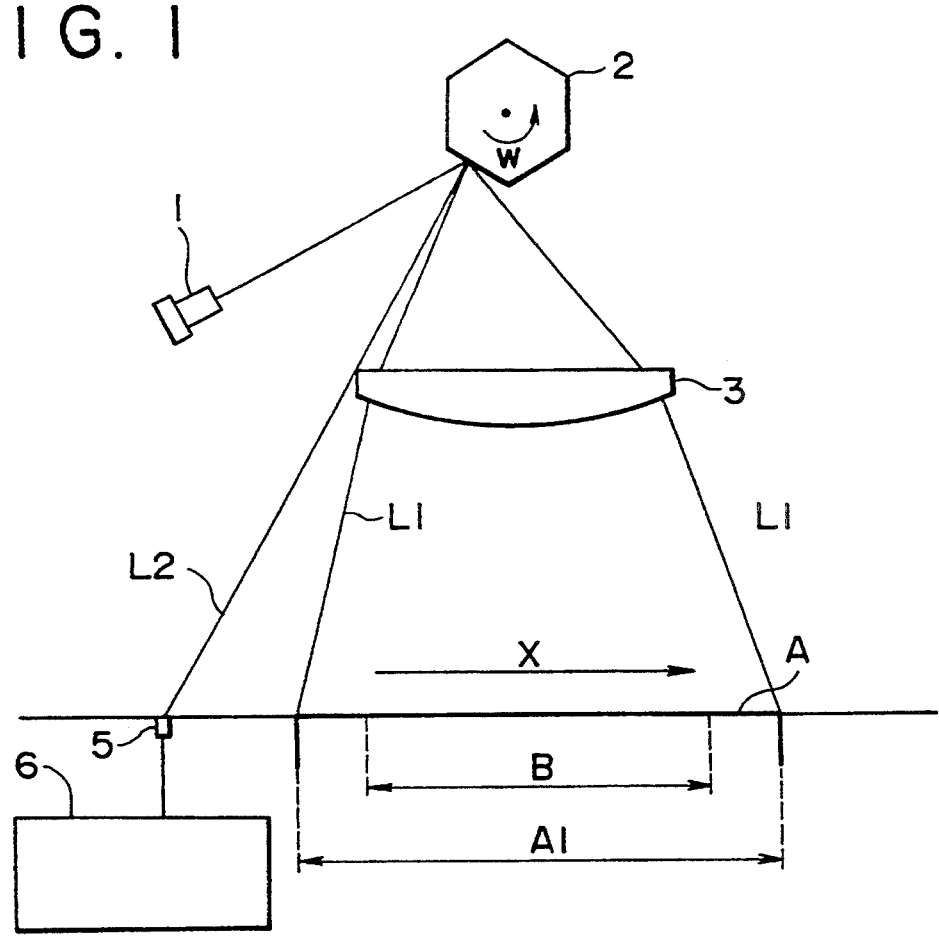
FIG. 1 shows a schematic construction of a laser scanning system to which the laser emitting apparatus according to the present invention can be applied.

FIG. 1 shows a schematic diagram of a laser scanning system to which the laser emitting apparatus according to the present invention can be applied. In the laser scanning system, a laser beam carrying image information, which is, for example, ON/OFF modulated, is emitted from a semiconductor laser 1. The laser beam is deflected by a deflector such as a polygon mirror 2, which rotates in a direction shown by arrow W. The deflected laser beam passes through the fθ lens 3, and scans in the direction indicated by arrow X on a photoconductive surface, e.g., a circumferential surface of a photoconductive drum A. Within the longitudinal zone A1 on the photoconductive surface, an image zone B is scanned by the ON/OFF modulated laser beam L1. In order to control the ON/OFF modulation of the laser beam so that it is synchronized with the scanning of the image zone B, the laser diode LD is driven to emit laser beam L2 that is used for detecting a scanning position. A light receiving element 5 is provided on an upstream side of the photoconductive surface A and detects the laser beam L2. The detection signal is generated by a detection unit 6 which is connected to the light receiving element 5. The APC (Automatic Power Control) operation is performed when the laser beam is not performing the image forming operation, i.e., after the scanning laser has passed through the image zone B and before it reaches the light receiving element 5.

Figure 2:
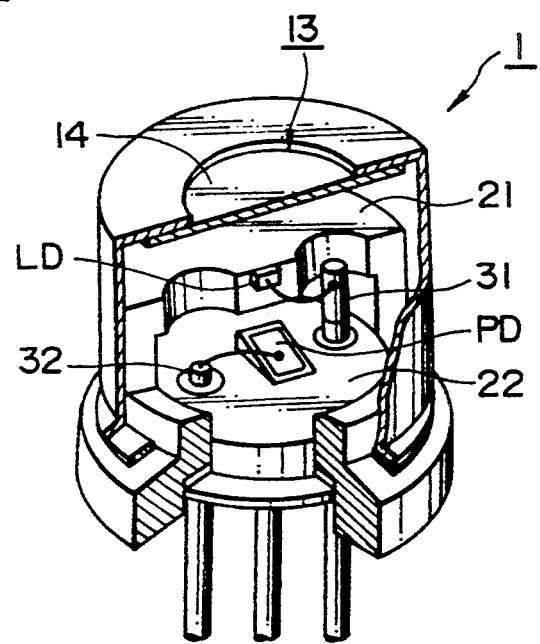
FIG. 2 is a partial perspective view of a semiconductor laser.

FIG. 2 is a partial broken perspective view of a semiconductor laser 1. The semiconductor laser 1 has a laser diode LD for emitting a laser beam and a photodiode PD, respectively mounted on base members 21 and 22. The laser diode LD and the photodiode PD are connected to terminals 31 and 32 through which current is applied. An opening 13 is formed on a case of the semiconductor laser 1, and a glass plate 14 is provided at the opening. The laser diode emits the laser beam in two opposite directions, i.e., toward the opening 13 and toward the photodiode PD. The laser beam emitted toward the opening 13 passes through the glass plate 14 and is deflected by the deflecting member 2 as described above. The photodiode PD receives the laser beam emitted by the laser diode LD and outputs a signal having a current that is proportional to the intensity of the received laser beam.

Figure 3:
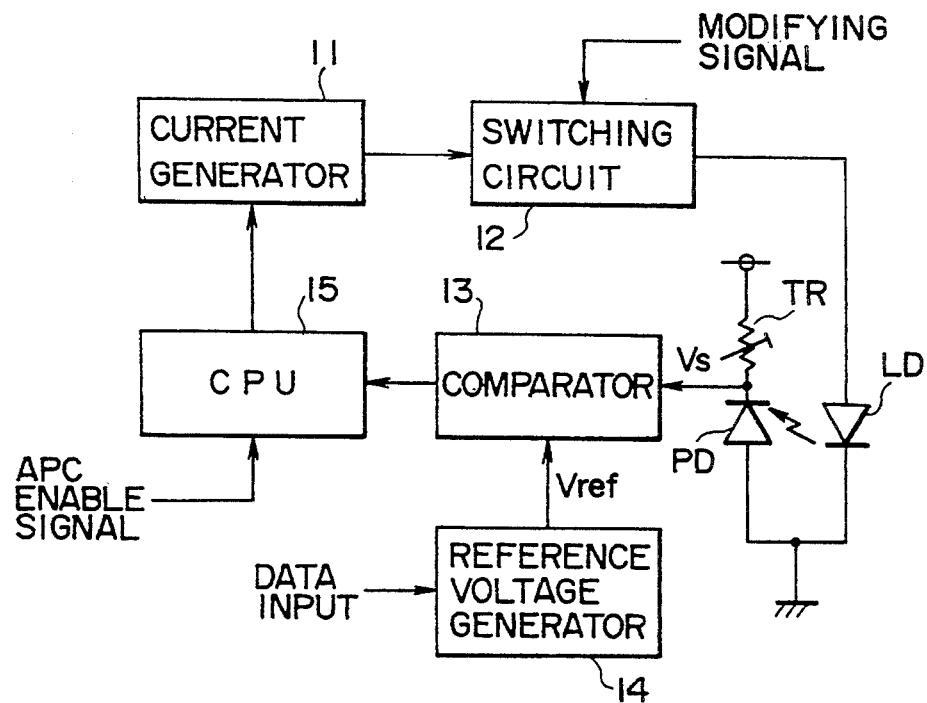
FIG. 3 is a block diagram of a laser emitting apparatus embodying the present invention.

FIG. 3 is a block diagram of a laser emitting apparatus embodying the present invention.

A current generator 11 for generating current to drive the laser diode LD is connected to the laser diode LD by way of a switching circuit 12. The switching circuit 12 is turned ON or OFF (ON/OFF modulated) in accordance with a modulation signal applied to it. The modulation signal is generated, synchronously with the scanning of the laser beam., based upon an image signal. Thus, the laser beam is turned ON or OFF while it scans the imaging zone B of the photoconductive surface A. An APC (Automatic Power Control) enable signal is applied to a CPU (Central Processing Unit) 15 to enable or disable the CPU 15 from executing the power controlling operation. When the CPU 15 is enabled to execute the power controlling operation, the following steps are repeated:

(a) the current generated by the photodiode PD passes through the variable resistor TR;

(b) a comparator 13 compares the voltage at the junction of the variable resistor TR and the photodiode PD with a reference value which is generated by a reference voltage generator 14; and (c) the CPU 15 controls the current generator 11 based upon the result of the comparator.

The APC operation is executed only when the laser diode LD emits a laser beam. Accordingly, the APC enable signal never enables the CPU 15 to execute the APC operation when the laser diode LD is not being driven. As the APC operation is being executed, the voltage Vs approaches the reference voltage, Vref.

FIG. 4 is a block diagram of the reference voltage generating circuit 140, contained within the reference voltage generator 14. The reference voltage generating circuit 140 has a clock generator 110, a level shifting unit 120, and an integrating unit 130.

The clock generator 110 generates a pulse-shaped clock signal having a predetermined frequency, the duty cycle of the clock signal being varied in accordance with data inputted.

Figure 5:
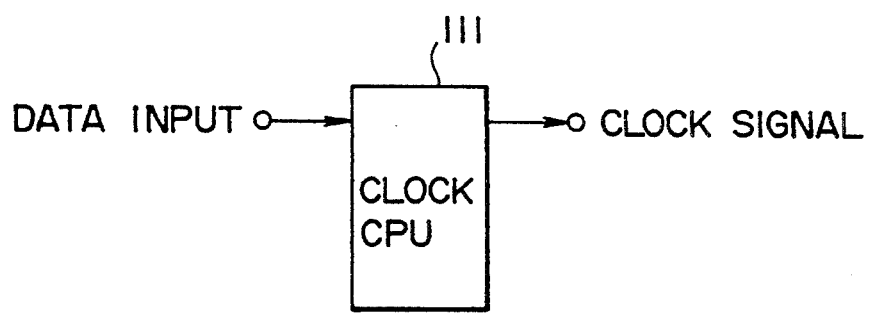
FIGS. 5 and 6 show diagrams of clock signal generating circuits.

FIG. 5 is a block diagram illustrating an example of the clock signal generator 110. In FIG. 5, a CLOCK CPU 111 processes a data signal in accordance with a preset program and generates a clock signal. The CLOCK CPU 111 outputs the pulse-shaped clock signal having a duty cycle in accordance with the inputted data.

Figure 6:
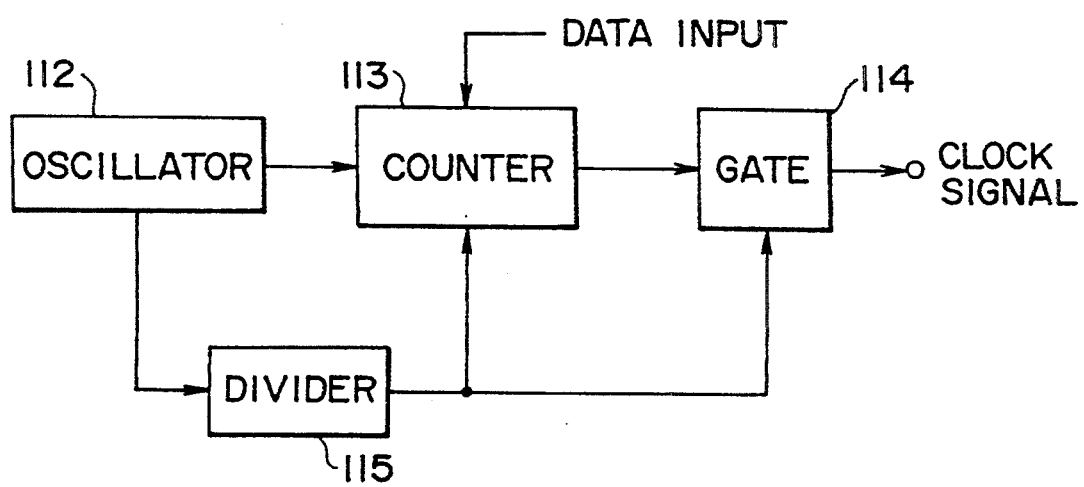

FIG. 6 is another circuit for the clock signal generator 110. In the circuit of FIG. 6, an oscillator 112, a counter 113, a gate circuit 114, and a divider 115 are provided. The oscillator 112 outputs a pulse signal having a predetermined fixed frequency. Count data (the number to be counted by the counter 113) is inputted to the counter 113 which counts the number of pulses of the pulse signal transmitted from the oscillator 112. The counter 113 outputs a count pulse every time it counts the number which has been inputted as the count data. The divider 115 divides the pulse signal transmitted from the oscillator 112 and outputs a divided pulse signal, which is applied to either the counter 113 or the gate circuit 114. The gate circuit 114 outputs an "H" or "L" signal based on the outputs of the counter 113 and the divider 115.

Figure 7:
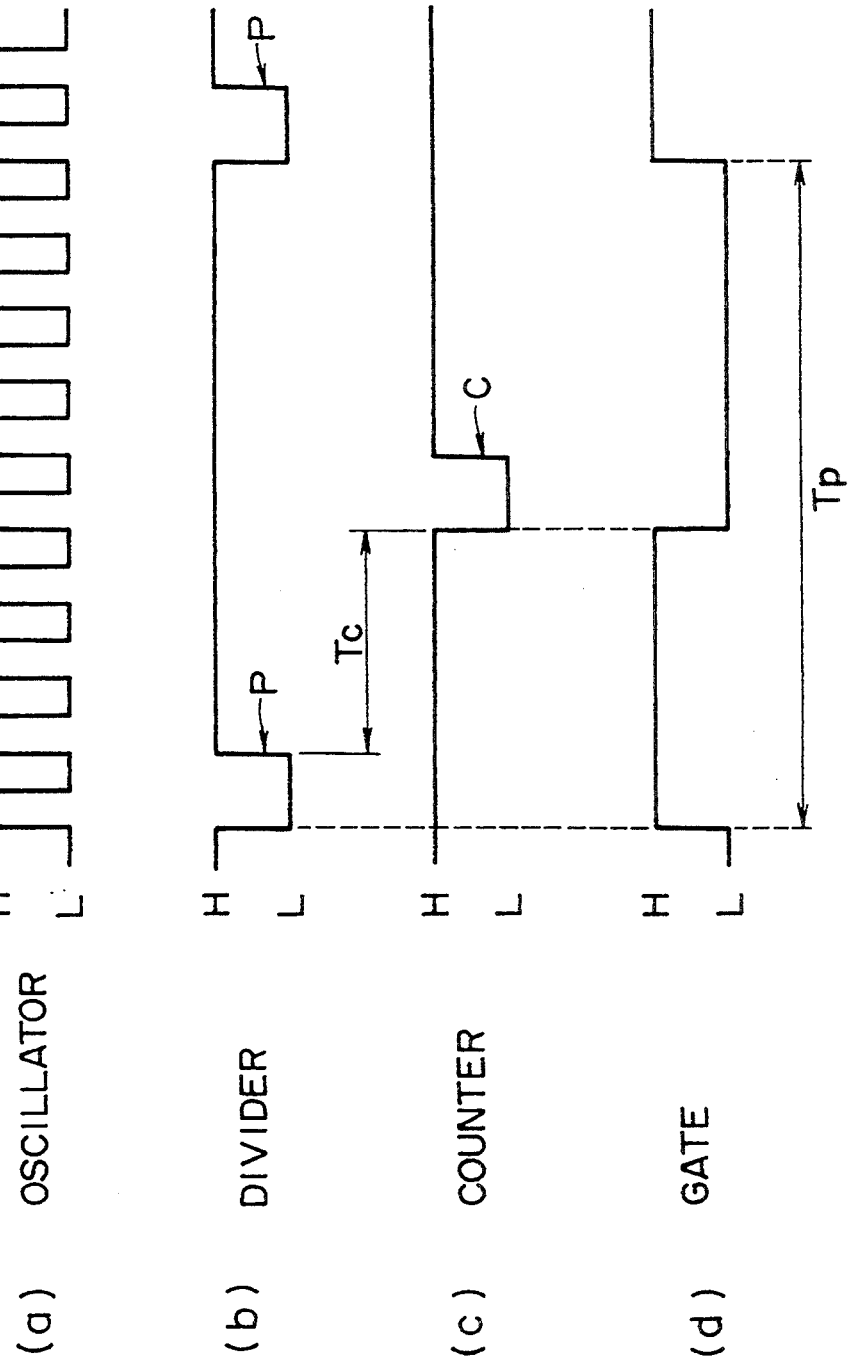

FIG. 7 is a timing chart illustrating the output waveform of (a) the oscillator 112, (b) the divider 115, (c) the counter 113, and (d) the gate circuit 114. As described above and shown in FIG. 7, the oscillator 112 outputs a pulse signal having a fixed frequency, and the divider 115 outputs a divided pulse signal, which is obtained by dividing the pulse signal outputted by the oscillator 112. After the divider 115 has outputted a pulse P, the counter 113 starts counting the number of clock signal pulses (within a period Tc). When the counter 113 counts the number which was inputted as the count data, the counter 113 outputs a pulse C. The gate circuit 114 outputs "H" on the falling edge (H to L transition) of the divided pulse signal outputted by the divider 115. The gate 114 outputs "L" on the falling edge (H to L transition) of the count signal outputted by the counter 113. Thus, by changing the number to be counted by the counter 113, the duty cycle of the signal can be changed within a fixed period Tp of one cycle. In other words, the circuit shown in FIG. 6 outputs a clock signal having a duty cycle which can be changed by changing the count data to be inputted to the counter 113.

The level shifting unit 120 has, as shown in FIG. 4, a comparator 121 which compares a threshold voltage Vt with the magnitude Vin of the clock signal transmitted from the clock generator 110, a voltage source 122 for generating a regulating voltage Vr, a pair of resistors R2 and R3 for dividing the regulating voltage Vr, a buffer 123, and a pulldown resistor R4. The level shifting unit 120 compares the magnitude Vin of the clock signal with the threshold voltage Vt by means of the comparator 121. If the magnitude Vin of the inputted clock signal is greater than the threshold voltage Vt, the comparator 121 outputs a regulated clock signal corresponding to the inputted clock signal. The voltage source 122 and the pair of resistors R2 and R3 regulate the magnitude of the clock signal outputted from the comparator 121 such that it has a value which is determined as follows:

$$V = Vr \times R3/(R2+R3)$$

where, V is the regulated voltage (voltage at the junction of resistors R2 and R3).

The regulated clock signal outputted by the level shifting unit 120 is applied to the integration unit 130 to obtain a voltage corresponding to the duty cycle of the pulse signal (described later). If the magnitude of the pulse signal to be applied to the integrating unit 130 is not a predetermined value, the voltage obtained by time integrating the pulse signal would not correspond to the duty cycle. In this embodiment, by regulating the magnitude of the clock signal with the level shifting circuit 120, the integrating unit 130 can produce a voltage that is proportional to only the duty cycle.

FIG. 8 shows waveforms of (a) the clock signal inputted to the level shifting unit 120, (b) the regulated clock signal outputted from the level shifting unit 120, and (c) the signal outputted from the integration unit 130, i.e., the reference voltage signal. In this embodiment, the regulating voltage Vr is set to a value smaller than the magnitude Vin of the inputted pulse signal so that the magnitude of the regulated clock signal is accurately adjusted to V. In other words, the magnitude of the regulated clock signal outputted from the level shifting unit 120 is always the fixed value V regardless of the magnitude of the inputted clock signal. The regulated clock signal is then applied to the integrating unit 130 through the buffer 123. The resistor R4 included in the buffer 123 is a pulldown resistor to cancel the offset introduced by the buffer 23.

The integration unit 130 has an integration circuit 131 including a resistor R1, a capacitor C1, and a buffer 132. The integration circuit 131 receives the regulated clock signal from the level shifting unit 120 and outputs the time integrated voltage signal (i.e., the reference voltage Vref) as shown in FIG. 8. The magnitude of the integrated voltage (reference voltage) Vref is calculated as follows:

$$Vref = V \times b/a$$

where, "a" is a fixed period of the clock signal (i.e., a period of the regulated clock signal), and "b/a" is a duty cycle of the regulated clock signal outputted by the level shifting unit 120. A resistor R5 is a pulldown resistor for canceling the offset introduced by the buffer 132.

As described above, the reference voltage generating circuit 140 outputs the reference voltage Vref in accordance with the data which is inputted to the clock generating circuit 110. The magnitude of the reference voltage Vref is proportional to the duty cycle of the pulse signal generated by the clock generator 110.

With the above construction, the APC device according to the present invention operates as follows.

When the laser beam scans outside the imaging zone B (or preferably, out of the longitudinal zone A1), the switching circuit 12 is turned ON and the APC enable signal is applied to the CPU 15 in order to perform the APC operation. The laser beam emitted by the laser diode LD is received by the photodiode PD. The photodiode PD outputs a signal having a current that is proportional to the intensity of the received laser beam. The current flows through the variable resistor TR, and voltage Vs is generated. The voltage Vs is applied to the comparator 13, and is compared with the reference voltage Vref generated by the reference voltage generator 14. Based upon the comparison, the CPU controls the current generator to drive the laser diode LD so that the voltage Vs approaches the reference voltage Vref.

When the intensity of the laser beam is to be changed, an operator inputs data representing a duty cycle of the clock signal to be generated by the clock generator 110. Then, as described above, the clock generator 110 outputs a clock signal having a period "a", in which an interval "b" in FIG. 8 is changed. Therefore the clock signal having a duty cycle of b/a is outputted. The clock signal is regulated by the regulating unit 120, and integrated by the integrating unit 130. Thus the reference voltage Vref which corresponds to the duty cycle of the clock signal is outputted.

FIG. 9 shows the relationship between the power of the emitted laser beam and the duty cycle of the clock signal. In this embodiment, the power of the laser beam increases in proportion to the duty cycle. The power is 1.0 mW (milliwatts) when the duty cycle is ½, and the power is 0.5 mW when the duty cycle is ¼.

As described above, according to the present invention, by changing the duty cycle of a clock signal, the power of the emitted laser beam can be changed. Further, a subtle change of the power of the laser beam can be done utilizing this construction.

FIG. 10 shows a modified level shifting unit 120M. In this modification, instead of the resistors R2 and R3 of the circuit in FIG. 4, a variable resistor VR is provided. With this construction, the magnitude of the regulated clock pulse, and therefore the magnitude of the reference voltage Vref, can be changed by changing the resistance of the resistor VR. Thus, it becomes possible to enhance or limit the variable range of the power of the laser beam.

It is also possible to vary the voltage of the voltage source 122. By changing the voltage of the voltage source 122, the magnitude of the regulated clock pulse can be easily changed, and the variable range of the laser power can be changed.

According to the present invention, the intensity of the laser beam changes as the duty cycle of the clock signal changes. Thus, the change of the intensity of the laser beam can be performed at high speed. For example, according to the present invention, it is possible to change the intensity of the laser beam before each scanning operation. Thus an operator can select the optimum intensity of the laser beam in accordance with the image to be formed.

The APC device according to the present invention changes the intensity of the laser beam by changing a duty cycle of a signal, without operating a variable resistor, a switch, or the like. Thus, even if the APC device is accommodated in a sealed casing, the intensity of the laser beam can easily be changed.

Further, if the clock generator is constructed such that a small change in the duty cycle can be made, then the intensity of the laser beam can also be finely adjusted. Thus it would be possible to have the intensity of the laser beam be continuously variable.

Furthermore, the laser power increases or decreases in proportion to the duty cycle of the clock signal, and thus the adjustment of the intensity of the laser beam can be performed easily.

What is claimed is:

1. A power controlling device for laser emitting apparatus, comprising:
   a laser diode for emitting laser beam;
   first voltage generating means for generating voltage corresponding to the intensity of the laser beam emitted by said laser diode;
   second voltage generating means for generating a reference voltage, wherein said second voltage generating means includes:
   (a) means for generating a pulse signal, a duty cycle of said pulse signal being changeable; and
   (b) means for producing said reference voltage in accordance with the duty cycle of said pulse signal;
   comparing means for comparing the voltage generated by said first voltage generating means with said reference voltage generated by said second voltage generating means; and
   means for driving said laser diode so that the voltage generated by said first voltage generating means coincides with said reference voltage;
   wherein said means for generating a pulse signal comprises:
   means for generating a clock pulse signal;
   means for determining a period of said pulse signal based on said clock pulse signal; and
   means for changing the ON/OFF states of said pulse signal in accordance with the number of pulses of said clock pulse signal within a period of said pulse signal, whereby the duty cycle of said pulse signal is changeable;
   further wherein said determining means comprises a divider circuit for determining a period of said pulse signal by dividing the frequency of said clock pulse signal.

2. A power controlling device for laser emitting apparatus, comprising:
   a laser diode for emitting laser beam;
   first voltage generating means for generating voltage corresponding to the intensity of the laser beam emitted by said laser diode;
   second voltage generating means for generating a reference voltage, wherein said second voltage generating means includes:
   (a) means for generating a pulse signal, a duty cycle of said pulse signal being changeable; and
   (b) means for producing said reference voltage in accordance with the duty cycle of said pulse signal;
   comparing means for comparing the voltage generated by said first voltage generating means with said reference voltage generated by said second voltage generating means; and
   means for driving said laser diode so that the voltage generated by said first voltage generating means coincides with said reference voltage;
   wherein said means for generating a pulse signal comprises means for regulating a magnitude of said pulse signal outputted therefrom to be a predetermined value.

3. The power controlling device according to claim 2, wherein said means for generating a pulse signal comprises:
   means for generating a clock pulse signal;
   means for determining a period of said pulse signal based on said clock pulse signal; and
   means for changing ON/OFF states of said pulse signal in accordance with a number of pulses of said clock pulse signal within a period of said pulse signal, whereby the duty cycle of said pulse signal is changeable.

4. The power controlling device according to claim 2, wherein said means for producing said reference voltage comprises an integration circuit for integrating said pulse signal and obtaining voltage in accordance with the duty cycle of said pulse signal.

5. The power controlling device according to claim 2, wherein said regulating means comprises a voltage source for outputting a predetermined voltage, and means for dividing said predetermined voltage by a predetermined ratio, a divided voltage being the value to which said magnitude of said pulse signal is regulated.

6. The power controlling device according to claim 2, wherein said regulating means is capable of changing said predetermined value.

7. The power controlling device according to claim 2, wherein said regulating means comprises a voltage source for outputting a predetermined voltage, and means for dividing said predetermined voltage, a divided voltage being the value to which said magnitude of said pulse signal is regulated, wherein a dividing ratio of said dividing means is changeable.

8. The power controlling device according to claim 7, wherein said dividing means comprises variable resistor means.

9. A power controlling device for controlling the emission power of a laser diode in a laser emitting apparatus, comprising:

first voltage generating means for generating voltage corresponding to the intensity of the laser beam emitted by the laser diode;

means for generating a pulse signal;

means for regulating a magnitude of said pulse signal, outputted from said means for generating a pulse signal, to be a predetermined value;

second voltage generating means for generating a reference voltage in accordance with a duty cycle of said pulse signal;

comparing means for comparing the voltage generated by said first voltage generating means with said reference voltage generated by said second voltage generating means; and means for driving the laser diode so that the voltage generated by said first voltage generating means coincides with said reference voltage.

10. The power controlling device according to claim 9, further comprising:

means for varying the duty cycle of said pulse signal.

11. The power controlling device according to claim 10, wherein said means for varying the duty cycle of said pulse signal further comprises a data input mechanism for inputting data representative of a duty cycle to said means for generating a pulse signal.

12. The power controlling device according to claim 9, wherein said second voltage generating means for producing said reference voltage comprises an integration circuit for integrating said pulse signal and obtaining a voltage in accordance with the duty cycle of said pulse signal.

* * * * *